United States Patent
Shen et al.

(10) Patent No.: US 11,226,658 B2
(45) Date of Patent: Jan. 18, 2022

(54) APPARATUS AND METHODS FOR MOUNTING INFORMATION HANDLING SYSTEM HARDWARE COMPONENTS

(71) Applicant: DELL PRODUCTS L.P., Round Rock, TX (US)

(72) Inventors: Yi-Ning Shen, Yun (TW); Mei-Chih Wu, Taipei (TW); Chih-Wei Chang, Taipei (TW); Yen-Kai Chiu, Neihu (TW); Chin-Chung Wu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 638 days.

(21) Appl. No.: 16/017,372

(22) Filed: Jun. 25, 2018

(65) Prior Publication Data

US 2019/0391617 A1    Dec. 26, 2019

(51) Int. Cl.
*G06F 1/16* (2006.01)
*G11B 33/12* (2006.01)

(52) U.S. Cl.
CPC .......... *G06F 1/1658* (2013.01); *G11B 33/124* (2013.01); *G06F 1/1616* (2013.01); *G11B 33/123* (2013.01); *H01L 2224/48091* (2013.01)

(58) Field of Classification Search
CPC ........ G06F 1/187; G06F 1/185; G06F 1/1658; G06F 1/186; G06F 1/183–184; G06F 1/1615; G06F 1/1624; G06F 1/1679; G06F 13/409; G06F 3/0683; H05K 2201/10386; H05K 2201/10446; H05K 5/0221; H05K 5/0295; H05K 1/141; H05K 7/20418; H05K 7/1405
See application file for complete search history.

(56) References Cited

U.S. PATENT DOCUMENTS

| | | | | |
|---|---|---|---|---|
| 7,024,329 | B2 * | 4/2006 | Bench | G01R 31/2808 324/754.08 |
| 8,085,552 | B2 * | 12/2011 | Takao | H05K 3/368 361/807 |
| 8,415,964 | B2 * | 4/2013 | Yonezawa | G01R 1/44 324/756.03 |
| 8,927,871 | B2 * | 1/2015 | Kobayashi | H01R 13/2435 174/250 |
| 9,665,137 | B2 * | 5/2017 | Chi | H05K 7/12 |
| 2017/0105298 | A1 * | 4/2017 | Shiroishi | G06F 1/1658 |
| 2018/0102600 | A1 * | 4/2018 | Lai | G06F 1/185 |

(Continued)

OTHER PUBLICATIONS

Dell, "Dell OptiPlex 5250 All-In-One", Rev A00, Feb. 2017, 68 pgs.

(Continued)

*Primary Examiner* — Zachary Pape
*Assistant Examiner* — Amir A Jalali
(74) *Attorney, Agent, or Firm* — Egan, Enders & Huston LLP.

(57) ABSTRACT

Apparatus and methods may be provided that may include a single bracket (e.g., a single universal support or anchor bracket) capable of operably mounting or supporting multiple diverse configurations of system hardware components (e.g., such as solid state drive (SSD) cards) to an existing motherboard or other system support component/surface on or within the same system chassis of an information handling system.

23 Claims, 12 Drawing Sheets

(56) References Cited

U.S. PATENT DOCUMENTS

2019/0074614 A1* 3/2019 Chen .................. G06F 1/187

OTHER PUBLICATIONS www.storagereview.com, "Icy Dock EZ-Fit Lite Dual 2.5″ to 3.5″ Bracket Review", May 14, 2014, 3 pgs.
ModDIY, "m.2 NGFF NVMe SSD 2242 2260 2280 Length Extension Adapters (3 Pack)" Tweeted on Jun. 1, 2017, 3 pgs.
www.amazon.com, "ZTC Thunder Board M.2 (NGFF) SSD to SATA III Board Adaptor", captured from Internet on May 8, 2105, 5 pgs.
Dragonblogger.com, "ZTC Thunder Enclosure M.2 SSD to USB 3.0 Review", May 20, 2017, 5 pgs.
Kan et al., U.S. Appl. No. 15/631,773, filed Jun. 27, 2017, 43 pgs.
Casparian et al., U.S. Appl. No. 15/418,120, filed Jan. 27, 2017, 88 pgs.
Casparian et al., U.S. Appl. No. 15/418,232, filed Jan. 27, 2017, 83 pgs.

* cited by examiner

- SECTION A-A' -

- SECTION A-A' -

APPARATUS AND METHODS FOR MOUNTING INFORMATION HANDLING SYSTEM HARDWARE COMPONENTS

FIELD

This invention relates generally to information handling systems and, more particularly, to mounting information handling system hardware components.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Conventional solid state drives (SSDs) are currently available in three different standard sizes (e.g., from longest to shortest: M.2 2280, M.2 2242, and M.2 2230) with each different size SSD having a different length from the other size SSDs. Multiple different mounting bracket configurations are required for mounting the different standard size SSDs to threaded mounted holes provided on a printed circuit board (PCB) within the notebook computer chassis. These threaded mounting holes may be spaced apart on the PCB in positions corresponding to different mounting brackets designed for the different length SSDs. At least two different types and dimensions of conventional SSD mounting bracket configurations are required to allow mounting of three different lengths of SSDs to the PCB within a common notebook computer, with each of the two differently-configured and dimensioned types of conventional mounting being configured to mount only one corresponding type of shorter M.2 SSD (M.2 2242 or M.2 2230 SSD) in addition to the conventional threaded mounting holes provided on the PCB which supports the third and longest M.2 2280 SSD without a mounting bracket. In one example, an additional SSD extension bracket may be mechanically coupled to a shorter SSD to allow the shorter SSD to be mounted to the PCB using a threaded mounted hole provided on the PCB for a longer SSD. In another example, an extended plastic holder may be provided for receiving a shorter SSD. Such an extended plastic holder may be mounted with the received SSD in a position between the shorter SSD and a threaded mounted hole provided on the PCB for a longer SSD. Hard disk drives (HDDs) require a separate mounting bracket from each of the different SSDs. For example, a 2.5 inch HDD requires a different mounting bracket than a M.2 SSD.

Thin and light notebook computer platforms have been provided with a metal keyboard support bracket having a customized size and shape to provide rigidity and to support the notebook keyboard assembly in the base of the notebook chassis.

SUMMARY

The disclosed apparatus and methods may be implemented in one exemplary embodiment to provide a single bracket (e.g., a single universal support or anchor bracket) capable of operably mounting or supporting multiple diverse configurations of system hardware components (e.g., such as solid state drive (SSD) cards) to an existing motherboard or other system support component/surface on or within the same system chassis of an information handling system. In this embodiment, a single bracket may be so employed to simplify system assembly steps, and/or to reduce or otherwise simplify the number and type of required tools (e.g., printed circuit board assembly "PCBA" and SSD bracket tools) and fasteners (e.g., additional screws or bolts), as well as to eliminate the need for redundant or additional parts (e.g., two or more different SSD support brackets) and process steps that are conventionally required when changing (e.g., upgrading or retrofitting) between different SSD cards or modules, or when changing between a hard disk drive (HDD) and a SSD card or module. In one embodiment, only a single screwdriver and single screw may be required to change between two or more different types of hardware components (e.g., SSD modules) mounted to the same existing SSD support bracket in an information handling system chassis, i.e., without replacing or supplementing the existing SSD support bracket with another differently-configured SSD support bracket.

The above-described capability in turn makes initial and retrofit installation of upgraded system components (e.g., such as SSDs) easier in order to achieve increased system performance, both during initial system manufacture process and later when the system is deployed in the field. In one embodiment, this capability may be implemented to allow end users or other persons to freely upgrade, replace or otherwise change between different-sized SSD cards or modules independently, e.g., without requiring outside technical assistance or phone calls, and/or without requiring acquisition of additional SSD mounting parts (e.g., additional and different support bracket/s, additional and/or different motherboard, etc.), unique tools, and/or additional or different fasteners, and resulting in improved end user experience and increased user satisfaction. In a further embodiment, the assembly tools, parts and process steps required during system manufacturing and assembly may be reduced and/or simplified (including tooling and part numbers), resulting in increased productivity, cost savings and reduced system assembly cycle time and complexity.

In one exemplary embodiment, the disclosed apparatus and methods may be employed to enable a given smaller hardware component (e.g., such as 2.5" HDD) to be removed from an information handling system chassis and replaced in the field with a different and larger-size hardware component (e.g., such as a M.2 specification SSD), without requiring replacement of other system components (e.g., such as system motherboard, keyboard bracket, etc.) to which the hardware components is to be mounted. In another exemplary embodiment, a single SSD support bracket may be employed to support mounting (and interchangeability)

of three or more different length SSD modules (M.2 2280, M.2 2242, and M.2 2230), as compared to the need for two conventional types of SSD card support brackets to support mounting of the same three SSD modules. Further, the disclosed apparatus and methods may also be implemented in a scalable manner to allow installation of future-developed hardware components, e.g., such as larger and/or differently configured next generation SSDs installed in place of existing current generation SSDs.

The disclosed apparatus and methods may be implemented in a manner that improves on existing technology. As just one non-limiting example, many conventional portable information handling systems (e.g., such as notebook or convertible computers) are configured with a chassis design that makes it difficult or impossible to later upgrade from a 2.5" HDD to a M.2 SSD due to chassis size configuration, or require a replacement of the system motherboard or other chassis parts to support an upgrade to the M.2 SSD. In this regard, a conventional hybrid system installation that supports both a 2.5 HDD and a M.2 SSD is not possible for thin and light portable information handling system configurations (e.g., such as systems having form factor dimensions of 310 millimeters×220 millimeters×17 millimeters or other smaller or larger form factor with limited internal chassis space) due to the small system chassis form factor limitations. In other conventional cases, an increase in additional motherboard and motherboard complexity is required for either M.2 SSD configuration or 2.5" HDD configuration to support the ability to change between 2.5" HDD and M.2 SSD configurations because the limited X-Y space of the motherboard is only configured to support a single type of drive (HDD or SDD) together with other components (e.g., optical disk drive, battery, etc.) within a system chassis. This means that changing the motherboard dimensions is a common solution required to allow changing the type of installed storage drive.

In one respect, disclosed herein is an apparatus, including a bracket that itself includes: a first member having a top surface, bottom surface, first end, second end, and a central portion disposed between the first and second ends, the first member including an attachment point; at least one additional member attached to the first member, the additional member extending laterally with respect to the central portion; and at least one retainer disposed in or on at least one of the first member or the at least one additional member. The at least one additional member may reside on a spatial plane that is located beneath the bottom surface of the first member.

In another respect, disclosed herein is an information handling system including a chassis with an internal cavity defined therein, the information handling system further including a substrate disposed in the internal cavity and having a surface, the substrate surface having a first set of substrate features disposed thereon. The first set of substrate features may include: a first tang support extending upwardly from the substrate; and a first tang attached to the first tang support, the first tang being oriented substantially parallel to the substrate. The first set of substrate features may further include at least one receiver positioned and dimensioned to removably engage with a bracket to retain the bracket in an engaged relationship with the substrate features.

In another respect, disclosed herein is a method for changing the SSD present in an information handling system such as described above, in which the information handling system further includes a second set of the substrate features present in a different location on the substrate from the first set of substrate features, the second set of substrate features having the same characteristics of the first set of substrate features. The method may include the steps of: detaching a first solid state drive (SSD) from the bracket and removing the first SSD from electrical coupling with circuitry of the information handling system; removing the first SSD from the information handling system; removing the bracket from the first set of substrate features; and then either one of: i) rotating the bracket 180 degrees about its Z-axis, and re-engaging the bracket in a new position relative to the first set of substrate features, or ii) re-engaging the bracket in a new position with the second set of substrate features; providing a second and different SSD and having a different length than the first SSD; attaching the second SSD to the bracket while it is engaged in the new position; and electrically coupling the second SSD to the circuitry of the information handling system.

In another respect, disclosed herein is a method, including interchanging a hard disk drive (HDD) with a solid state drive (SSD) within an internal cavity of an information handling system chassis, including the steps of: decoupling the HDD from electrical coupling with circuitry of the information handling system; dismounting and removing the HDD from a HDD mounting location within an internal cavity of the information handling system; mounting a SSD holder having substrate features according to claim 12 to the same HDD mounting location within the internal cavity of the information handling system in place of the removed HDD; attaching a SSD to the bracket at the attachment point; and electrically coupling the SSD to circuitry of the information handling system.

Figure 1A:
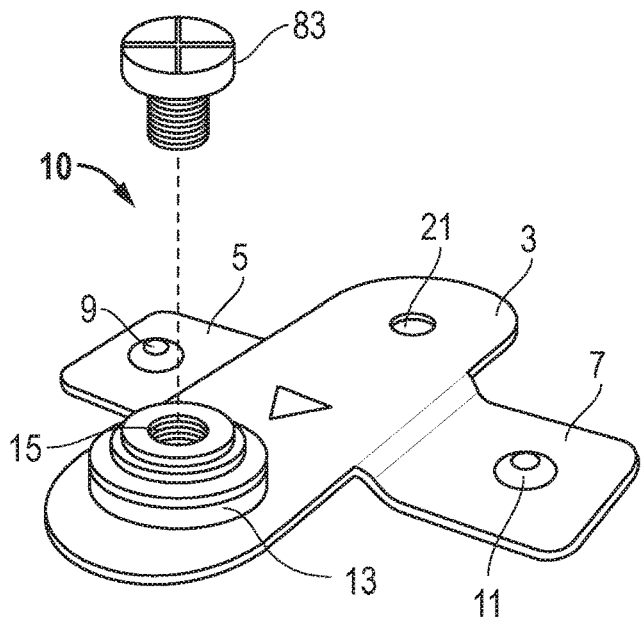
FIG. 1A is a front perspective view of a support bracket useful in accordance with some embodiments of the disclosure.

While the present disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the present disclosure is to cover all modifications, equivalents and alternatives falling within the spirit and scope of the present disclosure as defined by the appended claims.

DESCRIPTION OF ILLUSTRATIVE EMBODIMENTS

Referring to the drawings and initially to FIG. 1A, there is shown a perspective view of a support bracket 10 and mating fastener 83 useful in accordance with some embodiments of the present apparatus and methods of this disclosure. Support bracket 10 includes a body including an elongate member 3 having a boss 13 disposed substantially at one end thereof and wherein an attachment point in the form of an attachment provision 15 is provided atop boss 13. Selection of the height or thickness of boss 13 enables adjustment of the height at which attachment provision 15 is present, above the top surface of elongate member 3, e.g., to support a SSD or other hardware component in proper alignment with a connector. Attachment provision 15 in some embodiments includes a threaded hole suitable for receiving a fastener 83, such as a screw shown in exploded view, and accordingly attachment provision 15 includes one portion of a complementary pair of securing hardware that includes attachment provision 15 and fastener 83. It is within the scope of the present disclosure that other complementary pairs of securing hardware known to those skilled in the art may be substituted for a screw and the threaded hole provision located on boss 13, including without limitation snaps, rivets, clips, clamps, barbed fasteners, hook-and-loop type complementary fastener types, cotter pin arrangements, etc. In some embodiments, boss 13 is selected to not be present and attachment provision 15 is attached directly to the elongate member 3 at its top surface. In other embodiments, elongate member 3 itself includes a hole through its surface which functions as attachment provision 15, which may or may not be threaded depending upon the type of fastener selected to engage with the attachment provision. In other embodiments, a nut is present on the lower surface of elongate member 3 and a fastener such as a screw engages with the threads therein through a hole through the surface of elongate member 3. Elongate member 3 may be rectangular-shaped as shown, or may be any other suitable elongated shape (e.g., such as ellipse or irregular elongated shaped).

Figure 1B:
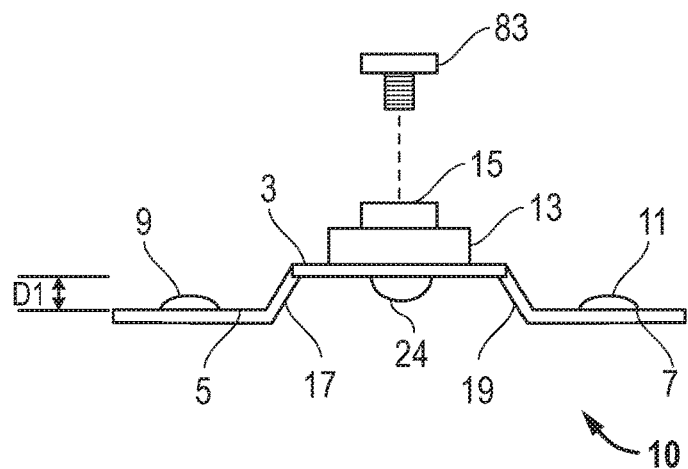
FIG. 1B is a side elevation view of a support bracket useful in accordance with some embodiments of the disclosure.
Figure 1C:
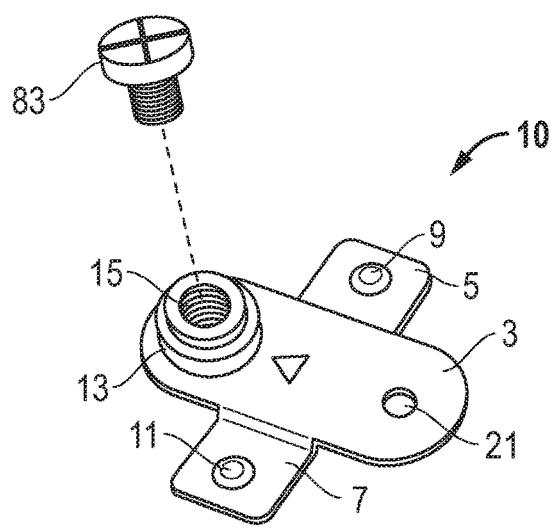
FIG. 1C is a rear overhead perspective view of a support bracket useful in accordance with some embodiments of the disclosure.

In some embodiments, the body of support bracket 10 also includes further a first side member 5 and a second side member 7, attached or otherwise formed substantially as shown in FIGS. 1A, 1B, 1C, extending outward from opposite sides of the central portion of elongate member 3. In some embodiments, each of elongate member 3, first side member 5 and second side member 7 may be planar as shown, although in alternate embodiments any selected one or more of these features (3, 5, and 7) may be substantially planar while the remaining features are non-planar. In some alternate embodiments, each of these features (3, 5, and 7) may be independently selected to be curved with a degree of curvature selected is sufficient to enable the functionalities described herein, e.g., such as when the substrate features to which they complement possess a mating degree of curvature as shall be understood after considering this specification in its entirety.

In some embodiments, there are provided a first protrusion 9 present on first side member 5 and a second protrusion 11 on second side member 7. Such protrusions 9,11 are considered as being retainers in the form of mechanical engagement features, inasmuch as they mechanically engage, or become mechanically engaged to certain mating substrate features, as herein described, for some embodiments. The general contour of these protrusions for some embodiments are showed in some aspect in FIG. 1B, being raised areas or semi-spherical bumps present on each side members 5 and 7. Similarly, in some embodiments, a depression 21 is present on the top surface of elongate member 3, which depression sometimes defines and reflects the location of a retainer (e.g., protrusion 24) present on the lower surface of elongate member 3 (shown in side perspective in FIG. 1B), although presence of depression 21 on the opposite side of elongate member 3 from protrusion 24 is not necessary. In some embodiments, the complementary nature of certain substrate features hereinafter described are shaped, configured and/or contoured sufficiently to enable the mechanical engagement features 9 and 11 to be selectively mated and engaged with the complementary features present on the substrate, in a detent fashion, as will be appreciated. Although the bracket mechanical engagement features 9 and 11 are retainers in the form of raised protrusions in the embodiment of FIGS. 1A, 1B and 1C, it will be understood that any other suitable retainer mechanical engagement configuration may be employed that is suitable for removably engaging and retaining support bracket 10 to a corresponding tang/s in secure mechanical engagement with the tang/s such as described further herein. In this regard, a retainer may be a protrusion, depression, etc. that is dimensioned and/or shaped to removably and mechanically engage with suitable mating substrate features to retain the position of support bracket 10 in a secure relation with a substrate, e.g., that requires an increased mechanical separation force to separate the engaged retainer/s from the mating substrate feature/s.

FIG. 1B is a side elevation view of a support bracket 10 of FIG. 1A in exploded relation to fastener 83 according to some embodiments, showing the respective locations of elongate member 3, first side member 5, second side member 7, boss 13, and attachment provision 15. First protrusion 9 and second protrusion 11 are shown, as is protrusion 24, which in some embodiments includes the lower surface of depression 21. Such protrusion 24 is also considered a retainer in the form of a mechanical engagement feature similar to that described above, inasmuch as it mechanically engages, or becomes mechanically engaged to a substrate feature as herein described, in some embodiments. There is a first displacement provision in the form of angled segment 17 and a second displacement provision in the form of angled segment 19, which connect first side member 5 and second side member 7 to elongate member 3. Thus, it is seen from FIGS. 1A, 1B and 1C that in some embodiments, displacement provisions may include angled segments 17 and 19 that are angled and disposed in a downward orientation from elongate member 3, as shown, which provides for the plane of the top surface of elongate member 3, to be non-co-planar with the plane of top surfaces of each of first side member 5 and second side member 7. It will be understood that the term "downward" is used here merely in relation to the orientation of the support bracket 10 as illustrated on the page in FIGS. 1A, 1B and 1C, and not necessarily in relation to the direction of gravity during actual use of support bracket 10.

As shown, in some embodiments the plane of the top surface of elongate member 3 may be separated by a distance D1 from the plane of top surfaces of each of first side member 5 and second side member 7. That is, in some embodiments the plane on which the top surfaces of the side members coincide is displaced lower than the plane of the top surface of elongate member 3. As will be appreciated, distance D1 is dimensioned sufficiently to permit support bracket 10 to be selectively engaged with complementary substrate features hereinafter described.

Although angled segment 17 and angled segment 19 in this exemplary embodiment are shown as being linear and angled as they appear, various alternate embodiments of displacement features are possible including, for example, features as being angled slightly differently in any selected amount yet sufficiently to enable support bracket 10 to be selectively engaged with substrate features also complementarily configured and dimensioned sufficiently to enable the functions herein set forth. In alternate embodiments, any degree of curvature for these features collectively selected by a user practicing the instant technology is within the scope of this disclosure when achieving the new functionality taught herein.

In some embodiments, elongate member 3 and the side members 5, 7 may all collectively include a unit of singular integral construction, such as when these features are collectively present on a single article of manufacture made by a stamping process, as in some illustrative embodiments wherein the article is comprised of stamped steel or stamped aluminum. In such embodiments, the protrusions 9, 11, 24 can be simultaneously provided in the stamping operation at the time the entire support bracket 10 is stamped. In other embodiments, support bracket 10 may be made from any selected thermoplastic or thermoset polymer resin such as by injection molding or any other suitable molding process known to polymer engineers, and the described features of support bracket are provided in a single operation. In yet other embodiments, elongate member 3 may be provided separately as a standalone article to which the two side members are subsequently attached thereto using conventional means including without limitation thermowelding, welding, spot welding, and the use of adhesives. Any of these alternates are also useful in providing boss 13 attached to elongate member 3, as well as attachment provision 15 being provided on boss 13. In some embodiments attachment 15 may be provided by machining boss 13.

FIG. 1C is a rear overhead perspective view of support bracket 10 of FIG. 1A in exploded relation to fastener 83, showing the respective locations of elongate member 3, first side member 5, second side member 7, protrusions 9, 11 and depression 21. Boss 13 and attachment provision 15 are also pictured.

Figure 1D:
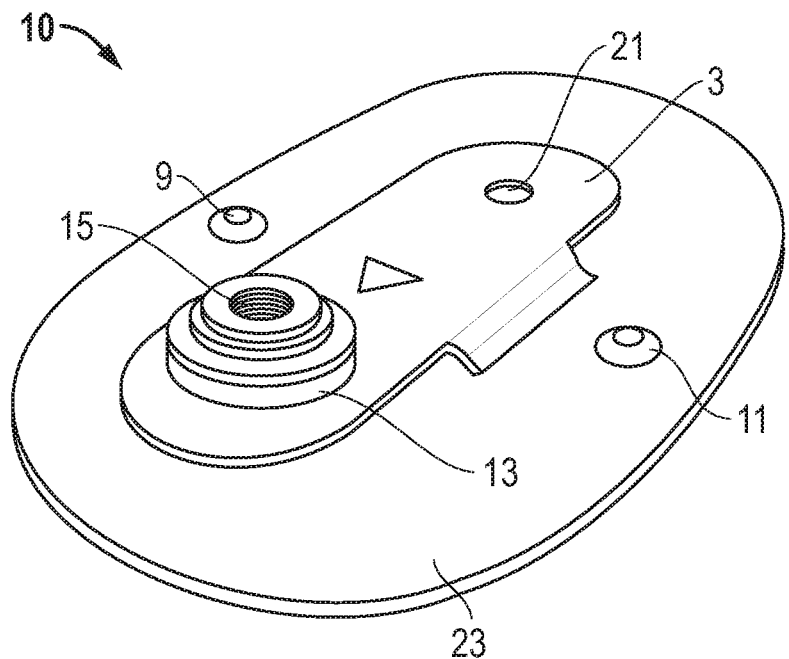
FIG. 1D is a front perspective view of a support bracket useful in accordance with some alternate embodiments of the disclosure.
Figure 1E:
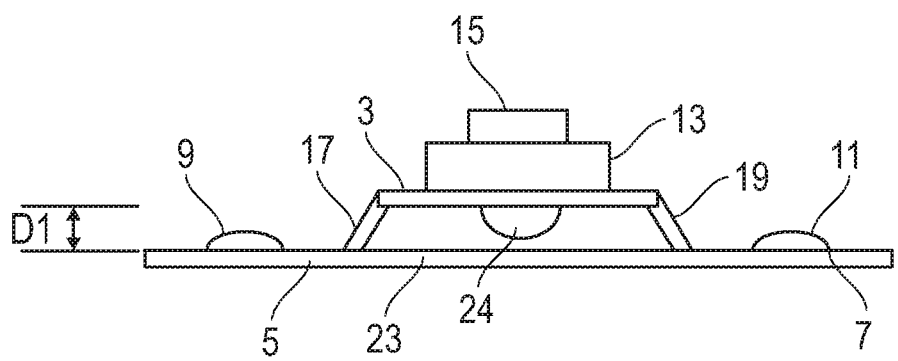
FIG. 1E is a side elevation view of a support bracket useful in accordance with some embodiments of the disclosure.

FIG. 1D is a front perspective view of a support bracket 10 according to some embodiments in which disc 23 includes, or is substituted for the side member elements 5, 7. As for embodiments when distinct side member elements are employed, disc 23 has a top surface and a bottom surface and is in some embodiments at least substantially planar in the areas at which first protrusion 9 and second protrusion 11 are disposed, for engagement with the substrate features herein described. In some embodiments, the entire disc 23 is flat. Yet in other embodiments, disc 23 has any desired degree of curvature, concavity or convexness to it, as may be selected by engineers to be present, subject the proviso that the protrusions 9, 11 are present and disposed sufficiently for engagement with the substrate features herein described. In further embodiments, disc 23 need not be round or ovoid as shown, when viewed from an overhead perspective, but may be selected to have any of a rectangular shape, a square shape, an oblong shape, a pentagonal shape, hexagonal, etc. FIG. 1E shows a side elevation view of embodiments according to FIG. 1D.

Figure 2A:
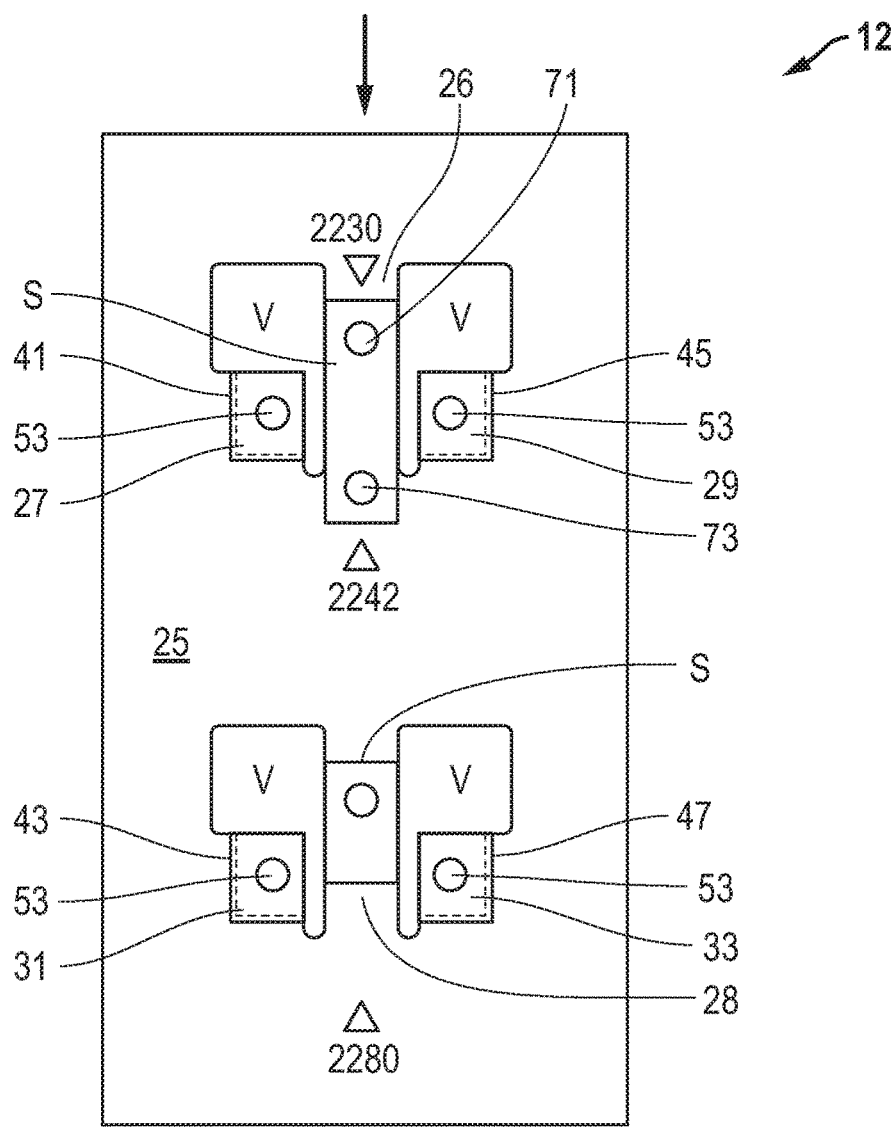
FIG. 2A is an overhead view of a substrate having substrate features useful according to some embodiments of the disclosure.

In FIG. 2A is shown an overhead view of a substrate 25 (e.g., sheet metal, plastic sheet, molded metal or plastic, cast metal, etc.) having substrate features 12 useful in accordance with some embodiments of the disclosure. In general, substrate features 12 may be present on a substrate, such as substrate 25, which may be planar or substantially planar. The substrate features 12 may be provided in sufficient configuration and dimension so as to mate with and/or functionally engage with the features present on support bracket 10.

In FIG. 2A are shown the locations of tang supports 41, 43, 45 and 47, which are associated with engagement tangs 27, 31, 29, 33, respectively. In some embodiments each of the tang supports (also shown in FIGS. 2B-2E) can be substantially planar and provide support for a respective engagement tang, the proximal ends of the tang supports being attached to substrate 25 and the distal ends of the tang supports being attached to a respective engagement tang. In some embodiments, engagement tangs 27, 31, 29, 33, may each include a substrate feature in the form of a receiver that in this embodiment is a recess 53 (e.g., circular hole or other suitable shape) defined in its mating surface, e.g., partially or completely through the respective engagement tang. Each such receiver (e.g., recess 53) may be provided and positioned to receive and engage one of retainers (e.g., protrusions 9 and 11) that are present as mechanical engagement features on the side members 5 and 7 of support bracket 10, in a detent fashion. This detent may be achieved for some embodiments by the semi-spherical contour of the protrusions 9 and 11 engaging at least partially within corresponding circular holes present on the respective tang supports in a non-permanent, retaining, slight interference fit.

Although protrusions 9, 11 of support bracket 10 are depicted and described for some embodiments as being semi-spherical, dome-shaped or the like, it will be understood that other geometric shapes of retainer engagement features (other than protrusions) are within the scope of the instant technology. Similarly, recesses 53 present on the tang supports may be dimensioned and contoured in essentially any geometrical shape such that the recesses 53 (e.g., holes or their selected equivalent) engage with the support bracket protrusions (or their selected equivalent) in a non-permanent, retaining, slight interference fit which is describable as a detent engagement. Moreover, it is possible that retainer characteristics of the support bracket and receiver characteristics of the substrate features may be reversed in some embodiments, e.g., protrusions may be provided as receivers on each of engagement tangs 27, 31, 29, 33 that are shaped and positioned for mating and engaging with corresponding retainers provided in the form of recesses defined in side members 5 and 7 of support bracket 10.

Still referring to FIG. 2A, also provided in some embodiments are substrate features in the form of receivers that in this embodiment are recesses (e.g., circular holes) 71, 73, 75, each of which may be defined in substrate 25 and located and dimensioned to engage retainer (e.g., protrusion 24) of support bracket 10 in a detent fashion such as previously described for retainers (e.g., protrusions 9, 11) and receivers (e.g., recesses) of the engagement tangs. In some embodiments, any one of recesses 71, 73, 75 may be so engaged with protrusion 24 of support bracket 10 at the same time as protrusions 9, 11 are engaged in the recesses present on tangs 27, 29 or 31, 33 thereby maintaining support bracket 10 in a fixed position with respect to substrate 25. In one embodiment, this may be enabled partially by configuring the distance D2 between the lower surfaces of tangs 27, 29 (FIG. 2C) and the top surface of substrate 25 to correspond sufficiently with or be slightly less than the distance D1 of FIG. 1B, also taking into account the amount by which protrusions 9, 11, 24 extend or project away from the surfaces upon which they are present to be received into corresponding recesses of the engagement tangs as described and illustrated further herein. As stated above, it is possible that retainer characteristics of the support bracket and receiver characteristics of the substrate features may be reversed in some embodiments, e.g., protrusions may be defined as receivers 71, 73, 75 in substrate 25 and located and dimensioned to engage a retainer recess 24 of support bracket. Moreover, although support bracket 10 is illustrated as including three retainers 9, 11 and 24 for removably engaging and retaining support bracket 10 in secure mechanical engagement with a substrate 25, it will be understood that only one (e.g., only retainer 24) or only two retainers (e.g., retainers 9 and 11) may be employed in alternate embodiments, as may be more than three retainers on given support bracket 10.

In some embodiments, the distances of D1, D2, and the distance that the protrusions 9, 11, 24 project from the surfaces on which they are disposed are dimensioned to provide a snug fit, thereby maintaining support bracket 10 in a selectively removable engagement with surface features 12 to any degree of rigidity desired. In some embodiments, these dimensions are provided so that an interference fit requiring about 0.5 Newton of force is necessary to engage or disengage support bracket 10 with substrate features 12. In other embodiments, these dimensions are provided so that an interference fit requiring about ten Newtons of force is necessary to engage or disengage support bracket 10 with substrate features 12. However, it is within the scope of the instant disclosure that these features may be dimensioned to provide any desired degree of force for engagement or disengagement of support bracket 10 from or with substrate features 12, the selection of which will depend upon the intended use and employment of substrate features 12, and the desires of engineers.

Figure 2B:
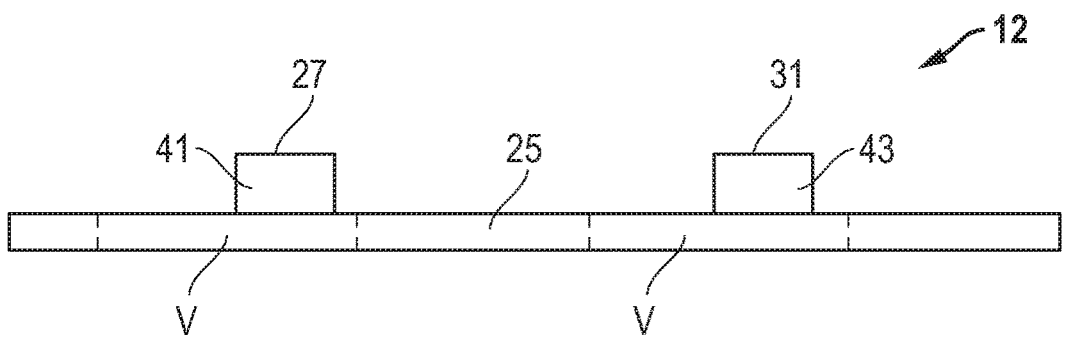
FIG. 2B is a side elevation view of a substrate and substrate features present thereon useful according to some embodiments of the disclosure.
Figure 2F:
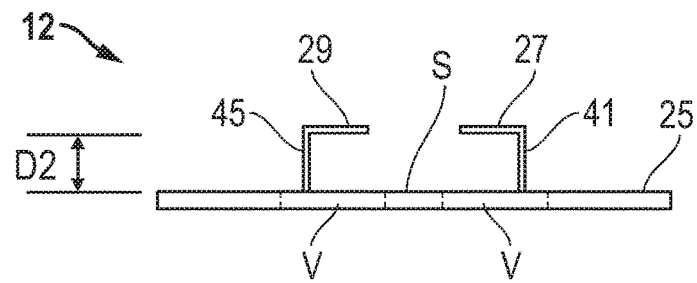
FIG. 2F is an end elevation view of a substrate and substrate features present thereon useful according to some embodiments of the disclosure.
Figure 3A:
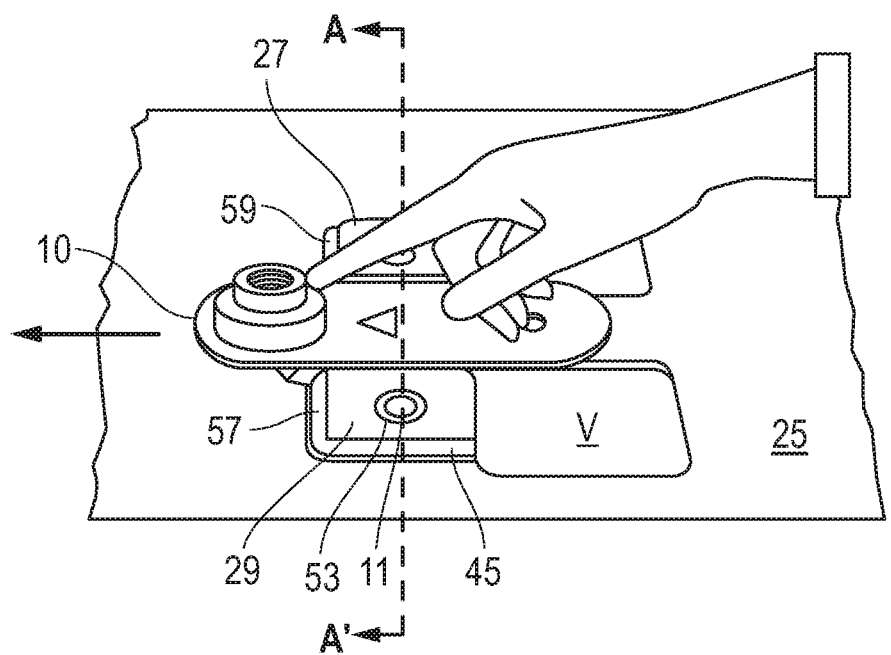
FIG. 3A is a perspective view of a support bracket engaged with surface features present on a substrate in accordance with some embodiments of the disclosure.
Figure 3B:
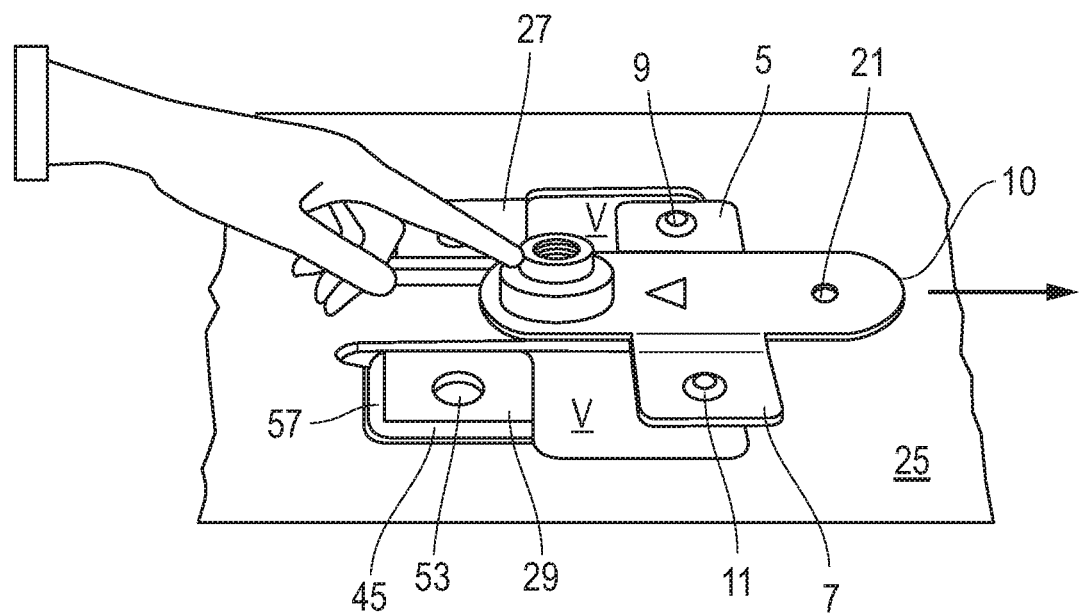
FIG. 3B is a perspective view of a support bracket and surface features present on a substrate in accordance with some embodiments of the disclosure in a disengaged configuration.

As shown in FIG. 2A, voids "V" may be defined in the body of substrate 25 with bridge regions 26 and 28 of substrate 25 defined between each respective pair of voids "V", and retention points in the form of holes 71 and 73 defined in the upper surface of bridge region 26 and hole 75 defined in the upper surface of bridge region 28 as shown. As further shown in FIG. 2A, a region "S" of substrate 25 is defined between tangs 27 and 29 (and associated voids "V" defined through the body of substrate 25), and between tangs 31 and 33 (and their associated voids "V" defined through the body of substrate 25). Each region "S" may be positioned in any suitable manner such that the upper surface of the region "S" contacts the lower surface of elongate member 3 of bracket 10 in sliding relationship when bracket 10 is mated and engaged with the features of substrate 25 as described further herein. For example, in some embodiments each region "S" may lie in the same plane as the remaining portions of planar substrate 25 adjacent to the tangs 27 and 29, and/or 31 and 33 as shown in FIG. 2F and in cross section of FIG. 3D herein. In such embodiments, voids "V" may be openings in substrate 25 that are dimensioned to receive side members 5 and 7 of bracket 10 such that the lower surface of elongate member 3 of bracket 10 is disposed in contact with upper surface of region "S" while side members 5 and 7 are at the same time positioned to be received by sliding under a respective pair of tangs 27 and 29, and/or 31 and 33 (as shown and described in relation to FIG. 2F and FIG. 3A herein) and into voids "V" that may optionally extend beneath tangs 27 and 29, and/or 31 and 33 as shown by optional dashed hidden lines in FIG. 2A.

Figure 2C:
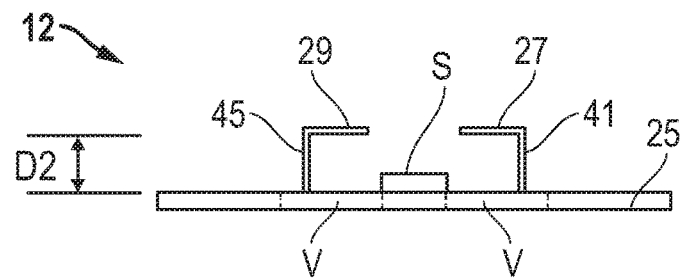
FIG. 2C is an end elevation view of a substrate and substrate features present thereon useful according to some embodiments of the disclosure.
Figure 2D:
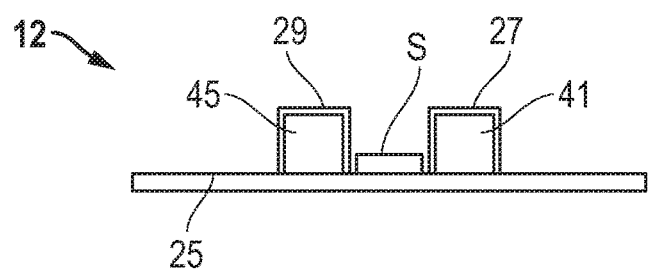
FIG. 2D is an end elevation view of a substrate and substrate features present thereon useful according to some alternate embodiments of the disclosure.
Figure 2E:
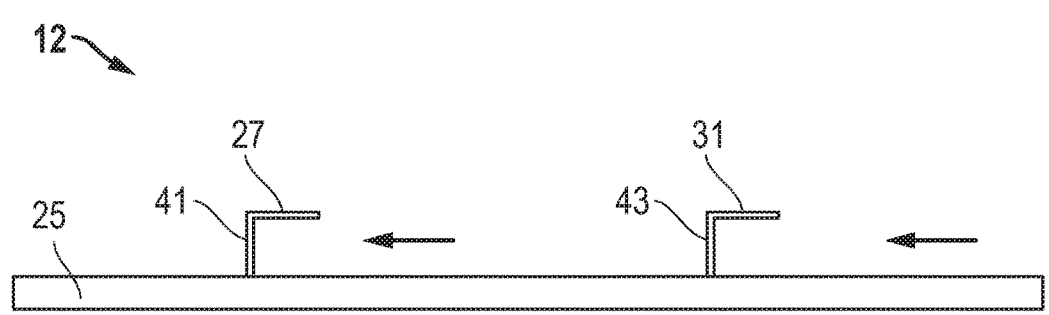
FIG. 2E is a side elevation view of a substrate and substrate features present thereon useful according to some alternate embodiments of the disclosure.
Figure 3C:
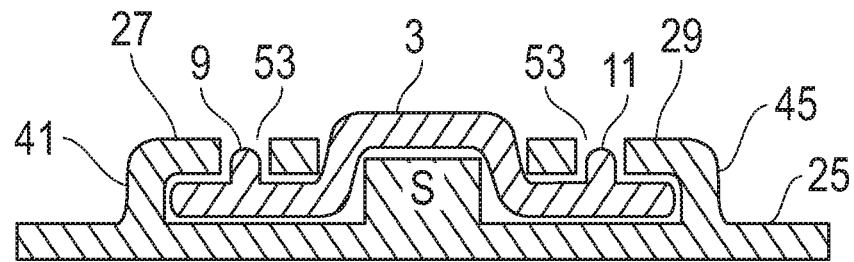
FIG. 3C is a cross-sectional view of a support bracket engaged with surface features present on a substrate in accordance with some embodiments of the disclosure.
Figure 3D:
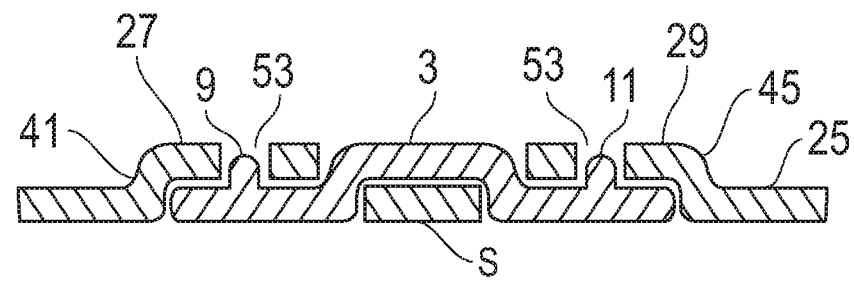
FIG. 3D is a cross-sectional view of a support bracket engaged with surface features present on a substrate in accordance with some embodiments of the disclosure.

In some alternate embodiments, the area or portion of substrate 25 in the shaded regions labeled "S" may be raised (to be of higher relief) with respect to the remaining portions of substrate 25 adjacent to the support tangs, as optionally selected by a user of the instant technology as shown in FIG. 2C, FIG. 2D and cross section of FIG. 3C herein. In such alternate embodiments this provision raises the relief at the location of holes 71, 73, 75 thereby permitting flexibility in dimension choices for distance D1 and D2 of support bracket 10 and substrate features 12. Providing a region or regions "S" to be of higher relief than the remainder of substrate 25 in the adjacent areas is a matter of simple engineering design in the case of metal or plastic molded articles when substrate 25 is selected to be fabricated of such metal or plastic, or by a metal stamping or casting process, etc. Where region or regions "S" are so raised to provide higher relief, voids "V" may be optional void areas defined through the surface of substrate 25. In such a case, distance D2 may be sufficiently large to allow side members 5 and 7 to be received between the upper surface of substrate 25 and lower surface of the tangs.

In any case, when present voids "V" may be provided from the manufacturing process, and may be made, for example, by a stamping and bending operation whereby the engagement tangs and tang supports hereinafter described may be formed. Such voids may also be optionally configured to reduce material costs, product weight, and in general may be located substantially wherever desired provided their presence does not interfere deleteriously to the function of the instant technology.

FIG. 2B is a side elevation view of substrate features 12 according to some embodiments, illustrating respective locations of substrate 25, engagement tang 27, engagement tang 31, tang support 41, and tang support 43, with voids "V" shown by dashed hidden lines. In such embodiments, engagement tangs 27 and 31 are supported and maintained in their orientation by virtue of tang supports 41, 43 respectively, which may be more clearly illustrated by further consideration of FIG. 2C, FIG. 2C being an end elevation perspective view of substrate features 12 as viewed from the direction of the arrow depicted at the top of FIG. 2A. Thus, in FIG. 2C tang supports 41, and 45 are seen to support engagement tangs 27 and 29 in this view, respectively, which is the same general arrangement by which engagement tangs 27, 31 of FIG. 2B are maintained in their position and orientation. Not shown in FIG. 2C are optional second tang supports 57 and 59 that may be optionally present as described and illustrated in relation to FIGS. 3A and 3B herein.

In some embodiments, engagement tang 29 and tang support 45 are each comprised initially of the same piece of material and are caused to be present in their depicted configuration by a single bending operation. The same can be said of the remaining associated pairs of engagement tangs and tang supports 27, 41 and 31, 43 and 33, 47. These tang support and engagement tang pairs can also in some embodiments be fabricated to be present during a molding process, which can include providing substrate 25 as having these features in a singular unitary article of manufacture, thereby providing an article such as depicted in FIG. 2A.

FIG. 2D is an end view of substrate features 12 analogous to that shown in FIG. 2A for some alternate embodiments, in which tang supports 41, 45 are oriented in a direction perpendicular to their orientation in the embodiments exemplified in FIG. 2A, 2C, by which the tangs are still provided in the same positions or locations shown in FIG. 2A. In such embodiments, support bracket 10 is able to be selectively engaged with the substrate features in a direction indicated by either of the arrows in the side elevation view of FIG. 2E. In such embodiments, tang supports 41, 43 act as a wall or stop, to prevent further insertion of support bracket 10 during engagement of support bracket 10 with the substrate features. In such alternate embodiments, holes are present and disposed through the surfaces of engagement tangs 27, 29, 31, 33 as for other alternate embodiments and located and oriented sufficiently to enable protrusions 9, 11 to selectively engage therewith in a detent fashion.

Regardless of whichever exact particular configuration is selected by a user of the instant technology for the substrate features, a support bracket 10 may be selectively engaged with the substrate features as shown in FIG. 3A and may be selectively removed therefrom, as shown in FIG. 3B. In this regard, the perspective view of FIG. 3A illustrates a method for engaging support bracket 10 with features selected to be present on a sub-portion of a substrate 25 of FIG. 2A, which entails pushing the support bracket 10 with a finger to engage the substrate features, e.g., by inserting side members 5 and 7 into respective voids V such that side members 5 and 7 are substantially in the same plane as bridge portion 26, and then sliding side members 5 and 7 under respective tangs 27 and 29 in the direction of the arrow in FIG. 3A. Shown here in FIG. 3A is a surface feature 53 present through the surface of engagement tang 29, which surface feature in this embodiment is a hole as previously mentioned and shown in FIG. 2A, for clarity. Second protrusion 11 present on second side member 7 (FIGS. 1A, 3B) of support bracket 10 is thus seen to engage with surface feature 53 in the detent fashion mentioned when support bracket 10 is pushed into place in the direction shown. Also shown in this embodiment is tang support 45.

Further provided in the embodiment of FIG. 3A are optional second tang supports 57 and 59 in the locations shown, which second tang support 57 serves the same support function for engagement tang 29 as does tang support 45, and which second tang support 59 serves the same support function for engagement tang 27 as does tang support 41. In embodiments such as this in which is selected inclusion of two of such tang supports, a pocket of sorts is formed which receives second side member 7 and prevents the movement of support bracket in all three spatial directions. In such configuration, second side member 7 is bound on its upper surface by the lower surface of engagement tang 29, by tang support 45 on one of its sides and by tang support 57 on another of its sides. These features collectively with the engagement of the protrusions 9, 11, 24 with other substrate features described herein provide for rigid retention of support bracket 10 in substrate features present. The engagement of the remaining side member 5 of support bracket 10 with the substrate features may be mirror-image identical to that for second side member 7, which is more clearly visible in the perspective view of FIG. 3B. Section A-A' of FIG. 3A is illustrated in cross-section in the alternate embodiments of FIGS. 3C and 3D previously described.

FIG. 3B shows an arrow indicating the direction of application of force that may be employed to remove support bracket 10 from substrate features with which it had been previously engaged. In general, this involves applying a force such as by the finger illustrated in the direction of the arrow shown, which causes support bracket 10 to be laterally displaced from the substrate features. These same provisions for selectively engaging or disengaging support bracket 10 from substrate features is in some embodiments applicable to all regions having such substrate features that are present on a substrate 25. FIG. 2A shows two of such sets of substrate features, each of which may receive support bracket 10 in a selectively attachable or detachable fashion. However, as now shown with reference to FIGS. 4A, 4B, 4C a mechanical synergy is provided by the instant technology by the substrate features provided herein being present on a selected substrate.

Figure 4A:
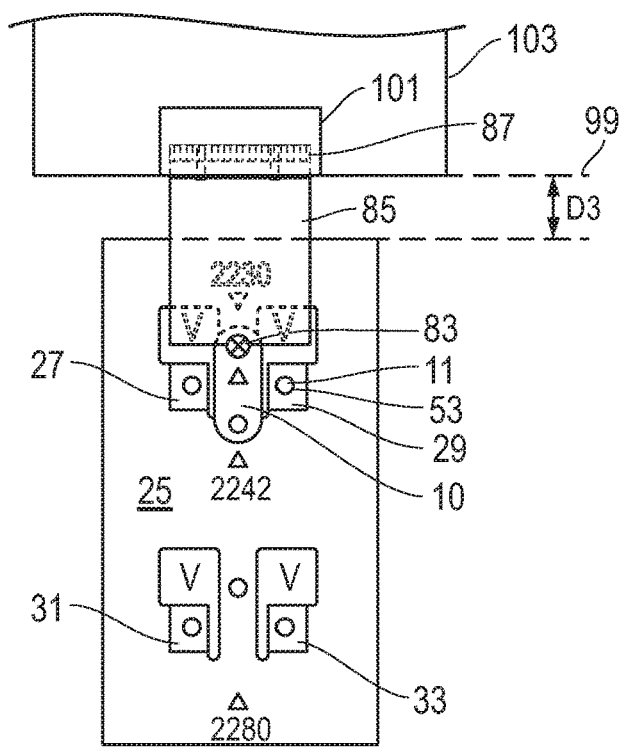
FIG. 4A is an overhead view of a first hardware component attached to a support bracket engaged with features present on a substrate in accordance with some embodiments of the disclosure.

FIG. 4A illustrates one exemplary embodiment or mode of structure and use of the instant technology. In the overhead view of FIG. 4A is shown substrate 25 having the features shown and described with respect to FIG. 2A present thereon. Also shown present in FIG. 4A is a relatively short hardware component 85 which may be any type of device useful in an information handling system, including without limitation, a circuit board having NAND memory chips disposed on it, solid-state drives (SSDs), etc. In the embodiment shown in FIG. 4A, the hardware component 85 is selected to be a thirty millimeter long M.2 2230 solid state computer drive (SSD), having a conventional M.2 (NGFF) connector 87 to which a mating M.2 connector of a cable or transfer card may be connected by inserting connector 87 into the mating connector. Hardware component 85 is effectively mounted to substrate 25 by the presence of support bracket 10 being engaged in a first orientation with substrate features including engagement tangs 27, 29. In first orientation of FIG. 4A, attachment provision 15 is positioned in this embodiment at a first distance to a mating M.2 connector 101 disposed on the edge of a PCB 103, such as a motherboard of an information handling system. Further, when so mounted, the end of M.2 card edge connector 87 is disposed at a position 99 relative to substrate 25, e.g., such as at a distance D3 from the edge of substrate 25 as shown in FIG. 4A that meets the connection clearance requirements for insertion into mating M.2 connector 101 to electrically connect or couple circuitry of the hardware component 85 (e.g., such as a SSD) with electronic circuitry (e.g., motherboard circuitry including CPU, volatile memory such as DRAM, etc.) of PCB 103. Further information on SSDs and use with information handling systems may be found, for example, in U.S. patent application Ser. No. 15/631,773 filed Jun. 23, 2017, which is incorporated herein by reference in its entirely for all purposes.

Figure 5:
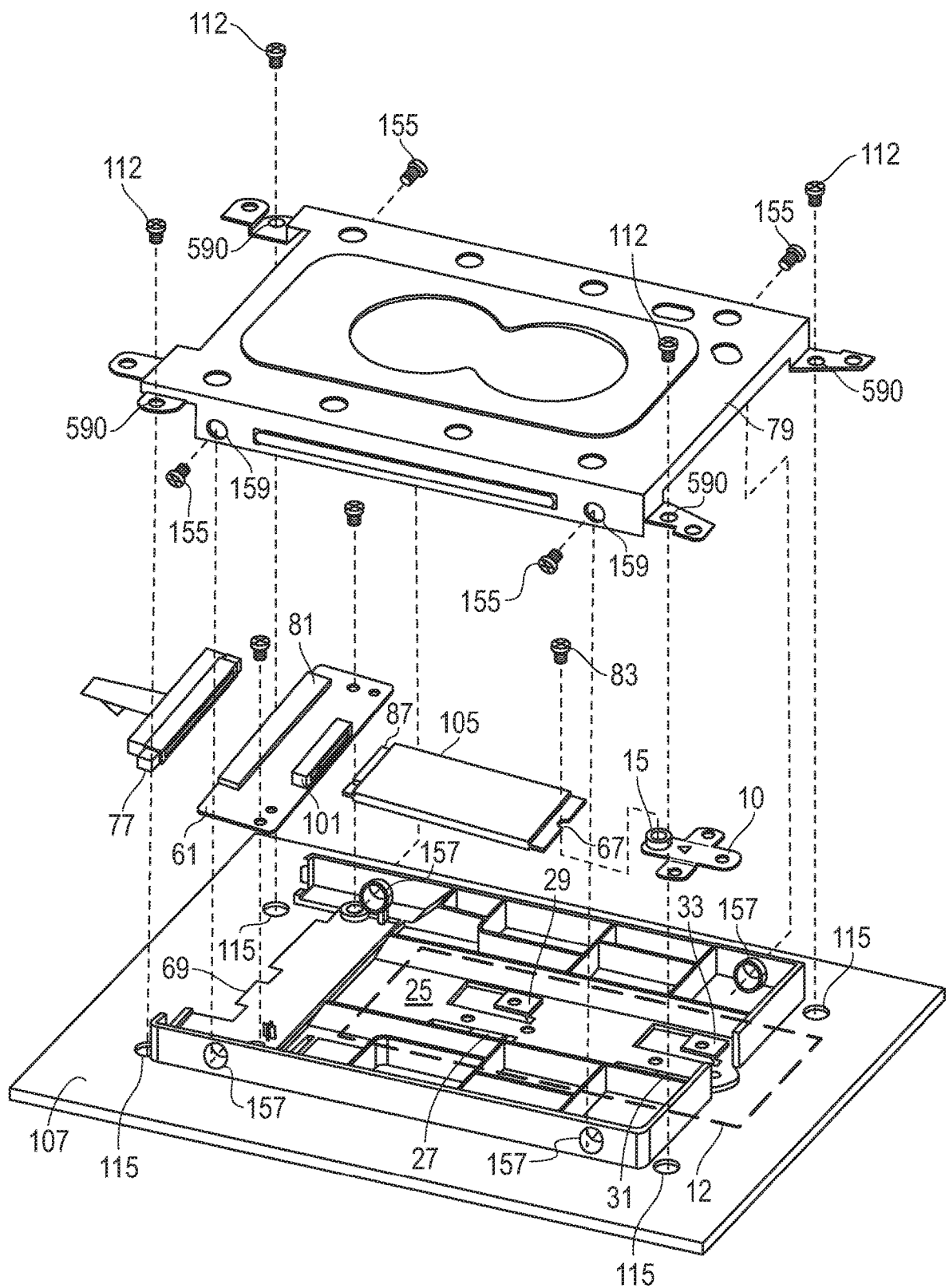
FIG. 5 is an exploded perspective view of a combination of a holder, cover, and internal components, in which the holder includes substrate features according to some embodiments of the disclosure.

In some embodiments, a fastener 83 may be threaded or screwed into the attachment provision 15 present atop boss 13 at the edge of the mounted hardware component 85 such that fastener 83 also engages the edge of hardware component 85 in a clamping arrangement, thereby rigidly affixing it to support bracket 10. This clamping arrangement is the result of fastener 83 passing through an attachment feature 67 defined through or otherwise present on hardware component 85, as more clearly shown in FIG. 5. In some embodiments, attachment feature 67 may be a half-moon shaped cutout on the edge of hardware component 85, while in other embodiments it may be a hole defined through hardware component 85. In any case, hardware component 85 is thus seen to be attached to support bracket 10 by a fastener engaging both it and the attachment provision 15 present on support bracket 10. Since support bracket 10 is in turn attached to the substrate features 12 as previously described, a selectively-removable attachment of hardware component 85 to substrate 25 is achieved.

In the event the performance or capabilities of hardware component 85 is deemed insufficient or otherwise unsatisfactory for a particular use, such as instances where hardware component 85 is a solid state drive (SSD) that is deemed too small in data capacity or too slow in data exchange, the instant technology permits for an easy change of hardware component 85. For example, in the embodiment of FIG. 4A, a user may merely remove fastener 83 to detach the hardware component 85 from support bracket 10 and thus substrate 25, which in some embodiments entails unscrewing a machine screw. Then, the M.2 card edge connector 87 of the existing relatively shorter hardware component 85 may be removed from insertion into the mating information handling system M.2 socket connector 101 by sliding hardware component 85 away from connector 101.

Figure 4B:
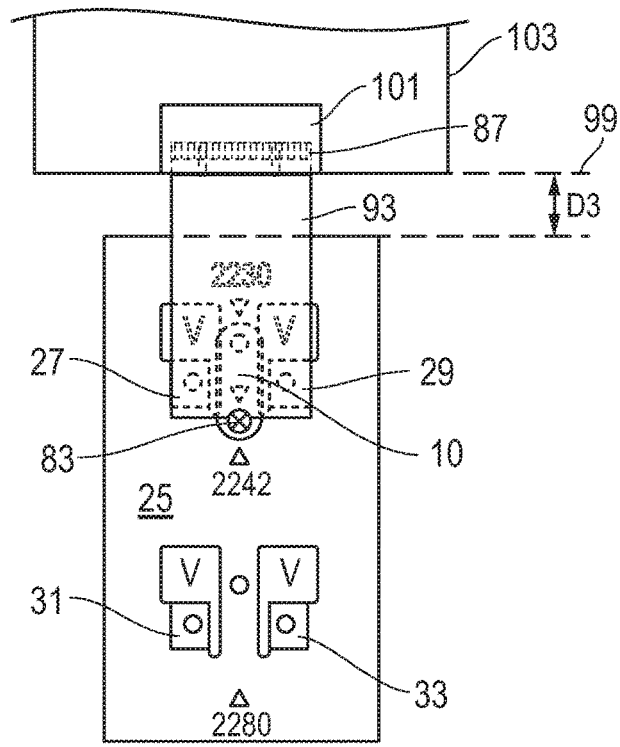
FIG. 4B is an overhead view of a second hardware component attached to a support bracket engaged with features present on a substrate in accordance with some embodiments of the disclosure.

Subsequently, for instances when a different relatively longer replacement hardware component 89 is to be installed, support bracket 10 is itself next removed from tangs 27, 29 of substrate features 12. Once removed, support bracket 10 may be rotated 180 degrees about its Z-axis and subsequently re-engaged in a second orientation with tangs 27, 29 of substrate features 12 as shown in FIG. 4B to position attachment provision 15 further away from connector 101 than it was in FIG. 4A. A M.2 card edge connector 87 of a second relatively longer hardware component 93 (e.g., a 42 millimeter long M.2 2242 SSD) may be inserted into mating M.2 connector 101 as shown in FIG. 4B Lastly, fastener 83 is commonly re-attached to attachment provision 15 and attachment feature 67 present on the different and longer hardware component 93. When so mounted, the end of M.2 card edge connector 87 of hardware component 93 is disposed at the same position 99 relative to mating socket connector 101 and substrate 25 (e.g., distance D3 from the edge of substrate 25) that meets the connection clearance requirements for insertion into mating M.2 socket connector 101. Thus, by the instant technology, a single substrate is seen to be conferred the ability to easily accommodate hardware components 85 and 93 having differing physical dimensions.

Figure 4C:
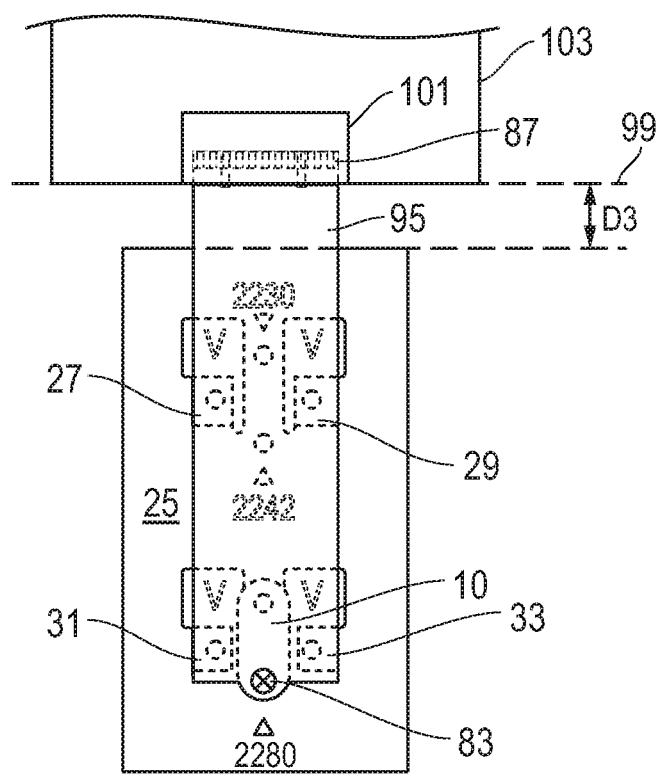
FIG. 4C is an overhead view of a third hardware component attached to a support bracket engaged with features present on a substrate in accordance with some embodiments of the disclosure.

Yet, further advantages are provided by the instant technology such as in instances when the hardware component 93 of FIG. 4B is deemed insufficient for a particular use. In such instance, a user removes fastener 83 to remove the attachment of the existing hardware component 93 from support bracket 10. Then, the existing hardware component 93 is withdrawn from engagement with socket connector 101 and removed. Subsequently, support bracket 10 is removed from tangs 27, 29 of substrate features 12. Once removed, support bracket 10 is subsequently re-engaged in the orientation shown with a different set of substrate features including tangs 31, 33 on substrate 25 that are further away from connector 101 than are tangs 27, 29, as shown in FIG. 4C. A M.2 card edge connector 87 of a third and relatively longest hardware component 95 (e.g., a 80 millimeter long M.2 2280 SSD) may be inserted into mating M.2 connector 101 as shown in FIG. 4C Finally, fastener 83 is commonly re-attached to attachment provision 15 and attachment feature 67 present on the different hardware component 95. When so mounted, the end of M.2 card edge connector 87 of hardware component 95 is disposed at the same position 99 relative to mating socket connector 101 and substrate 25 (e.g., distance D3 from the edge of substrate 25) that meets the connection clearance requirements for insertion into mating M.2 connector 101.

It is accordingly seen, that substrate features 12 in combination with support bracket 10 enable any selected substrate provided with said features to have the capability of accommodating multiple different sizes of hardware components, without need for any change of hardware such as brackets, fasteners and like hardware, and without need for any additional such hardware other than the different hardware component to be mounted (e.g., the SSD). It is seen from FIGS. 4A, 4B, 4C that three different length sizes of hardware components are readily able to be accommodated in an information handling system using the instant technology. However, it will be understood that the disclosed apparatus and methods may be implemented with a single pairs of tangs to accommodate only two different lengths of hardware components, or with two or more pairs of tangs to accommodate four or more different lengths of hardware components (e.g., by rotating the orientation of support bracket 10 in tangs 31, 33 of FIG. 4C and/or by providing three or more sets of tangs and substrate features). For example, other SSD lengths that may be additionally or alternatively accommodated include, but are not limited to 60 millimeter long M.2 SSDs and/or 110 millimeter long M.2 SSDs.

Figure 4D:
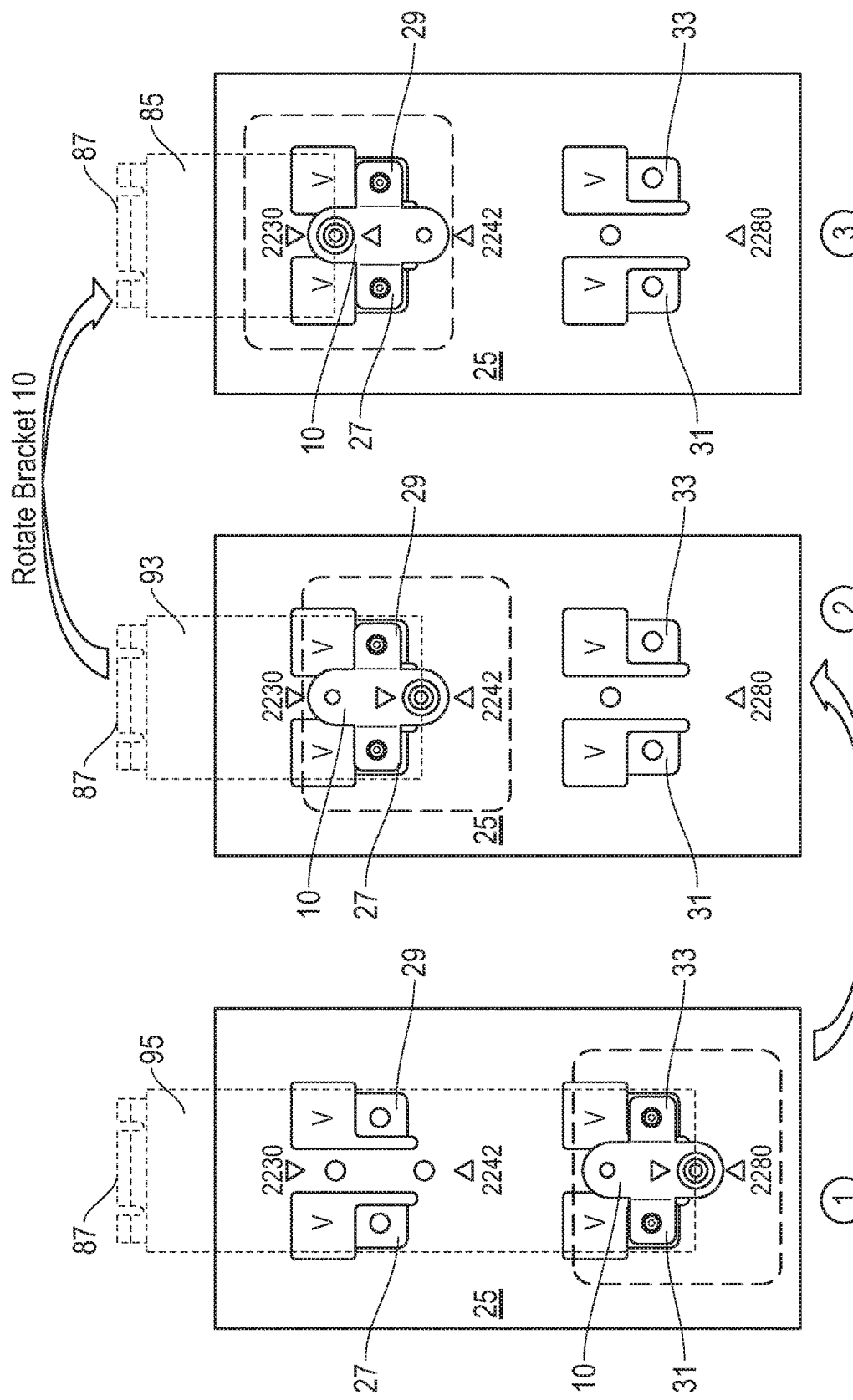
FIG. 4D illustrates methodology in accordance with some embodiments of the disclosure.

It will also be understood that the sequence of replacement or interchange between different SSDs or other types of hardware components may follow any sequence or may only involve one replacement step. FIG. 4D illustrates the method sequence steps 1), 2) and 3) that may be performed in reverse order as that described in FIGS. 4A-4C, with "Move" and "Rotate" referring to the changes in positioning and orientation of bracket 10 relative to substrate features 12. In this regard, bracket 10 is shown positioned in engagement with tangs 31 and 33 in step 1) to mount a M.2 2280 SSD 95 as shown. In step 2) installed M.2 2280 SSD card 95 is removed and bracket 10 is moved from engagement with tangs 31 and 33 to engagement with tangs 27 and 29 in order to mount a shorter M.2 2242 SSD card 93 as shown. In step 3) installed M.2 2242 SSD 93 is removed and bracket 10 is removed from engagement with tangs 31 and 33, rotated by 180 degrees and then engaged with tangs 31 and 33 in order to mount an even shorter M.2 2230 SSD card 85 as shown.

Figure 4E:
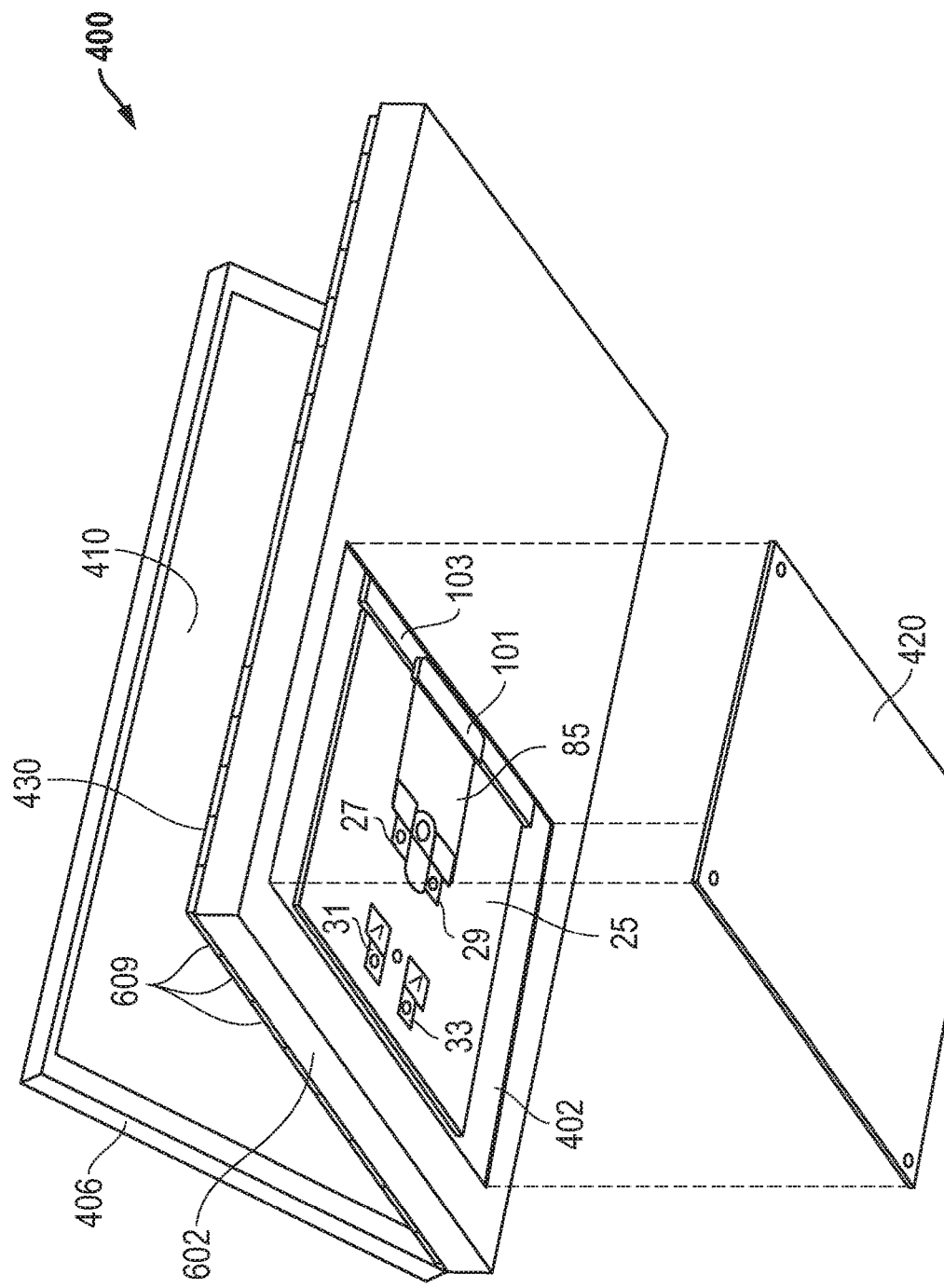
FIG. 4E illustrates a bottom perspective view of a portable information handling system in accordance with some embodiments of the disclosure.

FIG. 4E illustrates a bottom perspective view of a portable information handling system in the form a notebook computer 400 having a base chassis 602 and a lid chassis 406. Base chassis 602 may support a keyboard 430 for user entry, while lid chassis 406 may include a display (e.g., LED, LCD, etc.) for displaying information and images to a user. In FIG. 4D, an access cover 420 has been removed to expose a motherboard 103 and adjacent substrate 25 (e.g., metal or plastic mounting substrate) contained within an internal cavity 402 of base chassis 602. In FIG. 4D, substrate features 12 have been provided, including the aforedescribed tangs, for mounting different size M.2 SDDs in position for engagement with connector 101 on motherboard 103 as shown. In this embodiment, a user merely needs to remove the access cover 420 and perform the steps described in relation to FIGS. 4A-4D for changing SSDs. Further information on portable information handling systems may be found, for example, in U.S. patent application Ser. No. 15/418,120 filed Jan. 27, 2017 and in U.S. patent application Ser. No. 15/418,232 filed Jan. 27, 2017, each of which is incorporated herein by reference in its entirety for all purposes.

It will be understood that the disclosed support brackets may be employed with substrate features for a variety of mounting situations, and/or using a variety of different type substrates. For example, in some exemplary illustrative embodiments, with reference to the exploded perspective view of FIG. 5 it is seen that substrate features 12 according to the instant technology may be defined or otherwise made to be present on a substrate which includes the holder portion 69 (e.g., plastic or sheet metal holder) of an enclosure that is employable to replace a HDD in an information handling system installation, and to contain, house, or hold a SSD hardware component 105 corresponding to form factor M.2, or essentially any other similar or like computer hardware, that is useful in any information handling systems. SSDs and other devices which include readable and writable computer memory are often referred to as being mass storage devices. In such embodiments, a SSD 105 can be attached to a SSD signal (M.2)-to-HDD signal (SATA) signal transfer card 61 (e.g., which may contain memory management hardware and embedded command software), which transfer card 61 in turn is capable of being electrically connected to a conventional SATA or non-conventional SATA cable, or FFL via mating SATA card edge connector 81 and socket connector 77 and cable to motherboard in the usual way that a HDD (e.g., conventional form factor 2.5 inch HDD) is so connected by way of same connector 77. In some embodiments transfer card 61 enables NAND or other type solid state memory to communicate using the protocol normally employed by HDD hard drives.

In this embodiment, support bracket 10 is engaged with substrate features 12, and subsequently card edge connector 87 of hardware component 105 (e.g., SSD card) may be inserted into mating connector 101 and affixed to substrate 25 of holder portion 69 using support bracket 10 by means of fastener 83 as previously described. HDD carrier, cage or cover 79 may correspond to the dimensions of a conventional HDD drive carrier (e.g., such as a carrier for a 2.5 inch standard form factor internal hard drive), and may be attached to holder portion 69 by conventional hardware (e.g., threaded fasteners 155 received through aligned carrier openings 159 and threaded holder portion openings 157 of respective assembled HDD carrier 79 and holder portion 69), to provide in some embodiments, a SSD enclosure which can be quickly and efficiently installed or removed from any selected information handling system, e.g., as a replacement or alternative to a HDD. In one embodiment, HDD carrier 79 may be configured as dual purpose part that is configured both for attachment to holder portion 69 for mounting a SSD therebetween to a system component such as a sheet metal (or other suitable material) keyboard support bracket 107 of a notebook computer system (e.g., using fasteners 112 received through openings 590 of carrier 79 into threaded openings 115 defined within keyboard support bracket 107), and also for attachment to a HDD for mounting the HDD to the same system component such as the above described keyboard support bracket 107 of a notebook computer system (e.g., using fasteners 112).

In some embodiments holder portion 69 and cover 79 are dimensioned sufficiently to conform to any particular commonly employed dimensions which are accepted or defacto industry standards for computer HDD hard drives to allow replacement of like HDD type within an information handling system. This includes without limitation, the conventional 2.5 inch standard form factor, the mini-SATA or mSATA form factor, and also the smaller type commonly used in so-called "thin" laptop computers and the like. This embodiment may be implemented, for example, to provide the same information handling system chassis with the capability of containing a HDD or SSD, e.g., in the case of a chassis with sufficient interior space to accommodate a HDD but no additional space to also accommodate a SSD. Further end users may be enable to change from HDD to SSD by themselves, and need only be provided with the holder 69, transfer board 61, HDD wire to board connector 77 and the support bracket 10 to enable replacement of a HDD with a SSD in the same chassis. In yet another possible embodiment, the capability of supporting the presence and coexistence of a HDD and SDD together at the same time within the chassis (e.g., within notebook base chassis 602 of FIG. 4E).

Figure 6:
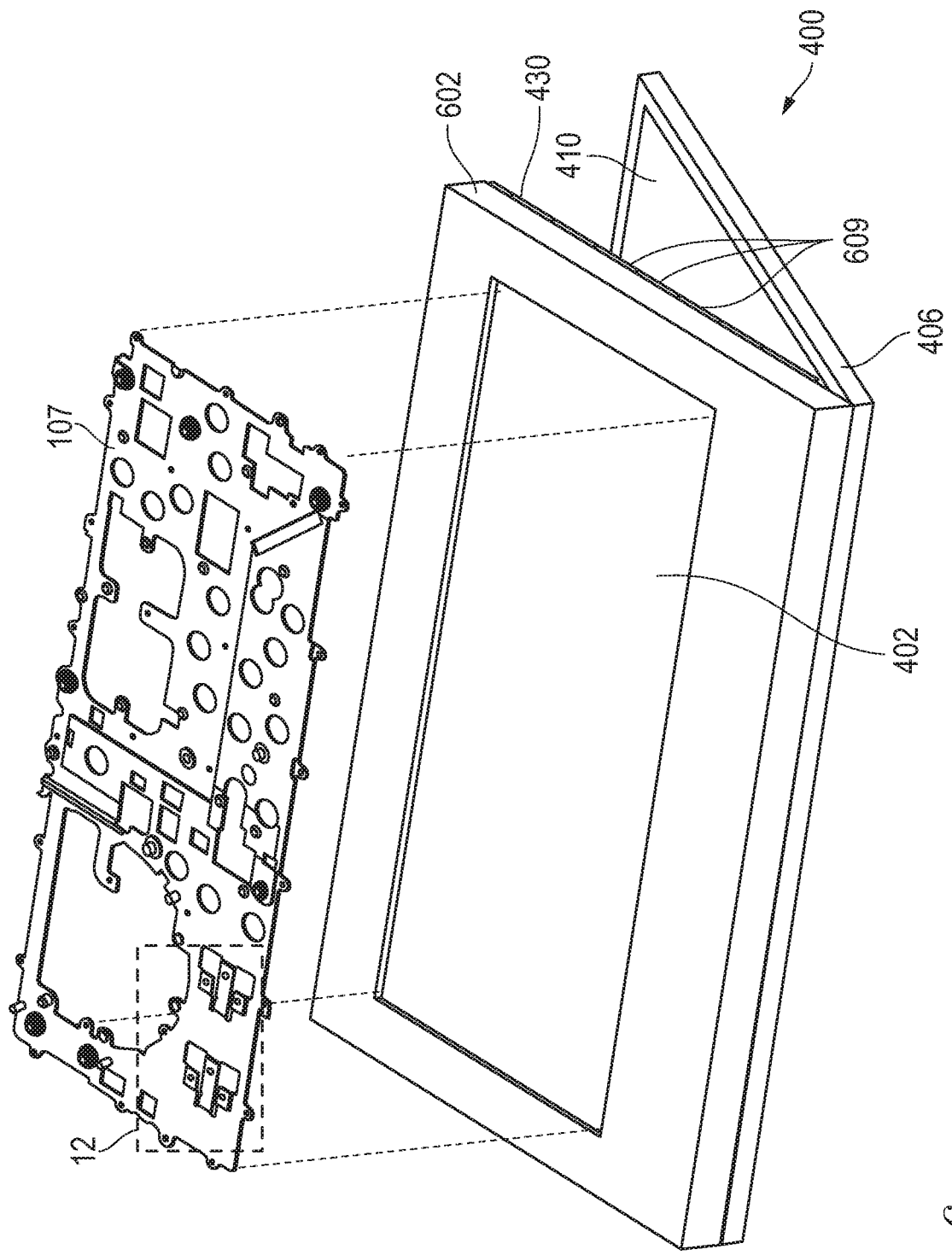
FIG. 6 is a perspective view of a keyboard support bracket having substrate features thereon in accordance with some embodiments of the disclosure.

Further advantages of the instant technology are seen with reference to the perspective view of FIG. 6, which illustrates a keyboard support bracket 107, similar in many regards to many of such articles employed in industry in the manufacture of computer keyboards. It is seen in the illustrative embodiment of FIG. 6 that substrate features 12 can be readily caused to be present on such a keyboard support bracket 107 that itself supports keyboard keys 609 of a keyboard 430 of a notebook computer system 400. Such a combination enables attachment of any selected hardware component 85 to such a keyboard bracket by means of support bracket 10, e.g., for a thin and light platform or information handling system chassis that is only large enough to contain SSD types (and not HDDs). It will be understood that in one embodiment, a suitable electrical connector (e.g., such a socket connector 101) may be mounted on keyboard support bracket or otherwise located in proper position for mating with a card edge connector 87 of a hardware components 85 such as illustrated and described elsewhere herein to electrically couple or connect electronic circuitry of the hardware component 85 (e.g., such as a SSD) with electronic circuitry (e.g., motherboard circuitry including CPU, volatile memory such as DRAM, etc.) of notebook computer system 400. Thus, the instant technology enables placement of components of information handling systems in locations previously not possible using conventional methods while simultaneously enabling rapid and easy upgrading or changing of components. While shown and described with reference to a keyboard support bracket, it is apparent the surface features 12 can be located at essentially any location within an information handling system chassis as desired by computer engineers when designing a new system or component thereof. In some embodiments, the surface features provided herein are made present on any selected printed circuit board. In some embodiments, the circuit board includes a computer motherboard.

A further advantage of the instant technology relates to the markings shown on substrate 25 in FIGS. 1A, 2A, 4A, 4B, 4C. In some embodiments, physical marks exemplified by the triangular arrows shown are useful in aiding a user to install a particular hardware component 85. It is seen in FIG. 4A that the triangular mark on support bracket 10 is pointed in the direction of another triangular mark present on substrate 25 (dashed lines) and associated with the number 2230 (dashed lines). This indicates that when support bracket 10 is installed as shown with these triangular marks pointing to one another, that this is the prescribed orientation of support bracket 10 within substrate features 12 for accommodating a 2230 M.2 SSD. Similarly, the triangular mark on support bracket 10 in FIG. 4B is pointed towards the triangular mark on substrate 25 that is associated with the designation 2242, representing that this is the proper installed position for a 2242 M.2 SSD. Likewise in FIG. 4C, the mark on support bracket 10 is pointed towards the mark associated with the designation 2280, indicating this is the correct orientation of support bracket 10 when a 2280 M.2 SSD is to be attached to substrate 25. Such index marks are of great value in removing uncertainty for users and make the instant technology fool-proof to a large degree. It is to be appreciated that the exact numerical or other marking designations which may be elected to be employed can change, as the dimensions of the substrate 25 and as different intended hardware components other than SSD's may be selected for a particular end-use deployment. Moreover, the dimensions of the substrate features themselves can be altered as necessary, including the dimensions of any selected substrate feature and its spatial distance or separation from any of the other substrate feature(s). In some embodiments, two support brackets 10 are simultaneously present in substrate features, for providing increased stability to hardware component 85.

It will be understood that one or more of the tasks, functions, or methodologies described herein (e.g., including those described herein for components attachable to a substrate) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed apparatus and methods may be utilized in various combinations and/or independently. Thus the invention is not limited to only those combinations shown herein, but rather may include other combinations.

What is claimed is:

1. An information handling system comprising a chassis with an internal cavity defined therein, the information handling system further comprising a substrate disposed in the internal cavity and having a surface, said substrate surface having a first set of substrate features disposed thereon, which first set of substrate features comprises:
- a first tang support extending upwardly from said substrate; and
- a first tang attached to said first tang support, said first tang being oriented substantially parallel to said substrate;
- where the first set of substrate features further comprise at least one receiver positioned and dimensioned to removably engage with a bracket to retain the bracket in an engaged relationship with the substrate features;
- where the information handling system further comprises the bracket removably engaged with the first set of substrate features, the bracket comprising:
  - a first member having a top surface, bottom surface, first end, second end, and a central portion disposed between said first and second ends, said first member comprising an attachment point,
  - at least one additional member attached to said first member, the additional member extending laterally with respect to said central portion, and
  - at least one retainer disposed in or on at least one of said first member or said at least one additional member,
  - where said at least one additional member resides on a spatial plane that is located beneath said bottom surface of said first member.

2. The information handling system of claim 1, where the first member comprises an elongate member having a first retainer; and where the apparatus further comprises:
- a second retainer disposed in or on said at least one additional member laterally with respect to said central portion; and
- a third retainer disposed in or on said at least one additional member laterally with respect to said central portion, and on the opposite side of said central portion from said second retainer;
- where said second and third retainers reside substantially on the same spatial plane, which plane is located beneath said bottom surface of said elongate member.

3. The information handling system of claim 2, wherein said at least one additional member comprises a first side member portion disposed laterally with respect to said central portion, and a second side member portion disposed laterally with respect to said central portion, wherein said second retainer resides on said first side member portion, and wherein said third retainer resides on said second side member portion.

4. The information handling system of claim 2, wherein each of said first, second, and third retainers are protrusions on the surfaces of said first and additional members; and wherein said attachment point comprises a threaded hole.

5. The information handling system of claim 2, where the first set of substrate features comprises:
- a second tang support extending upwardly from said substrate;
- a second tang attached to said second tang support at a position spaced apart from the first tang by a region of the substrate defined to extend between the first and second tangs, said second tang being oriented substantially parallel to said substrate; and
- a receiver disposed in or on said substrate at a location within the region defined to extend between said first tang and said second tang;
- where to retain the bracket in an engaged relationship with the substrate features said second retainer of the bracket is dimensioned to removably engage with a receiver of said first tang, said third retainer of the bracket is dimensioned to removably engage with a receiver of said second tang, and said first retainer of the bracket is dimensioned to removably engage with said receiver of said substrate.

6. The information handling system of claim 1, where the substrate features further comprise at least one receiver dimensioned to removably engage with the at least one retainer of the bracket to retain the bracket in an engaged relationship with the substrate features.

7. The information handling system of claim 6, wherein the region at which said receiver of said substrate is disposed is an area that is of higher relief than adjacent areas on said substrate.

8. The information handling system of claim 6, further comprising a second set of said substrate features present in a different location on said substrate, said second set of substrate features having the same characteristics of said first set of substrate features and having at least one different receiver dimensioned to removably engage with the at least one retainer of the bracket to retain the bracket in an engaged relationship with the substrate features in the same fashion as said first set of substrate features but in a different position relative to the substrate.

9. The information handling system of claim 6, further comprising a hardware component attached to said bracket at the attachment point.

10. The information handling system of claim 6, wherein said substrate is a component of a solid-state drive (SSD) enclosure having dimensions corresponding to a hard disk drive (HDD).

11. The information handling system of claim 6, wherein said substrate comprises a keyboard bracket of a portable information handling system.

12. An information handling system comprising a chassis with an internal cavity defined therein, the information handling system further comprising a substrate disposed in the internal cavity and having a surface, said substrate surface having a set of substrate features disposed thereon, which first set of substrate features comprises:
- a first tang support extending upwardly from said substrate; and
- a first tang attached to said first tang support, said first tang being oriented substantially parallel to said substrate;
- where the substrate features further comprise at least one receiver defined as a recess within the substrate and positioned and dimensioned to removably engage with a first retainer of a bracket to retain the bracket in an engaged relationship with the substrate features.

13. A method, comprising interchanging a hard disk drive (HDD) with a solid state drive (SSD) within an internal cavity of an information handling system according to claim 12, comprising the steps of:
- decoupling the HDD from electrical coupling or connection with circuitry of the information handling system;
- dismounting and removing said HDD from a HDD mounting location within the internal cavity of said information handling system;
- mounting a SSD holder having substrate features according to claim 12 to the same HDD mounting location within the internal cavity of the information handling system in place of the removed HDD;

attaching the SSD to said bracket at said attachment point; and
electrically coupling or connecting the SSD to the circuitry of the information handling system.

14. The method of claim 13, where the step of decoupling the HDD from the electrical coupling or connection with the circuitry of the information handling system comprises decoupling the HDD from a mating connector of the information handling system; and where the step of electrically coupling or connecting the SSD to the circuitry of the information handling system comprises electrically coupling or connecting a card edge connector of the SSD to the circuitry of the information handling system by coupling or connecting a signal transfer card between the card edge connector of the SSD and the mating connector of the information handling system with the card edge connector of the SDD being inserted into a socket connector of the signal transfer card.

15. The method of claim 13, further comprising mechanically coupling a cover to the SSD holder with the attached SSD disposed therebetween and the SSD holder mounted to the HDD mounting location within the internal cavity of the information handling system, the cover having outer dimensions corresponding to the outer dimensions of a HDD carrier of the removed HDD.

16. The information handling system of claim 12, where the set of substrate features further comprises at least one receiver defined as a recess within the first tang and positioned and dimensioned to removably engage with a second retainer of the bracket to retain the bracket in the engaged relationship with the substrate features.

17. The information handling system of claim 12, where the set of substrate features further comprises:
a second tang support extending upwardly from said substrate; and
a second tang attached to said second tang support at a position spaced apart from the first tang by a region of the substrate extending between the first and second tangs, said second tang being oriented substantially parallel to said substrate;
where the at least one receiver defined as a recess within the substrate is defined as a recess within the region of the substrate extending between said first tang and said second tang; and
where the set of substrate features further comprises:
at least one receiver defined as a recess within the first tang and positioned and dimensioned to removably engage with a second retainer of the bracket to retain the bracket in the engaged relationship with the substrate features, and
at least one receiver defined as a recess within the second tang and positioned and dimensioned to removably engage with a third retainer of the bracket to retain the bracket in the engaged relationship with the substrate features.

18. The information handling system of claim 12, further comprising the bracket removably engaged with the set of substrate features with the first retainer of the bracket removably engaged with the recess defined within the substrate to retain the bracket in the engaged relationship with the substrate features.

19. An information handling system comprising a chassis with an internal cavity defined therein, the information handling system further comprising a substrate disposed in the internal cavity and having a surface, said substrate surface having a first set of substrate features disposed thereon, which first set of substrate features comprises:
a first tang support extending upwardly from said substrate; and
a first tang attached to said first tang support, said first tang being oriented substantially parallel to said substrate;
where the first set of substrate features further comprise at least one receiver positioned and dimensioned to removably engage with a bracket to retain the bracket in an engaged relationship with the substrate features; and
where the information handling system further comprises the bracket removably engaged with the first set of substrate features, the bracket comprising:
a first member having a top surface, bottom surface, first end, second end, and a central portion disposed between said first and second ends, said first member comprising an attachment point, and
at least one additional member attached to said first member, the additional member extending laterally with respect to said central portion, and
at least one retainer disposed in or on at least one of said first member or said at least one additional member,
where said at least one additional member resides on a spatial plane that is located beneath said bottom surface of said first member, and
where said at least one receiver of the first set of substrate features is removably engaged with the at least one retainer of the bracket to retain the bracket in an engaged relationship with the substrate features.

20. The information handing system of claim 19, where the first set of substrate features comprises:
a second tang support extending upwardly from said substrate;
a second tang attached to said second tang support at a position spaced apart from the first tang by a region of the substrate defined to extend between the first and second tangs, said second tang being oriented substantially parallel to said substrate; and
a receiver of said substrate disposed at a location within the region defined to extend between said first tang and said second tang;
where the first member of the bracket comprises an elongate member having a first retainer, and where the bracket comprises:
a second retainer disposed in or on said at least one additional member laterally with respect to said central portion; and
a third retainer disposed in or on said at least one additional member laterally with respect to said central portion, and in or on the opposite side of said central portion from said second retainer;
where said second and third retainers reside substantially on the same spatial plane, which plane is located beneath said bottom surface of said elongate member;
where said second retainer is removably engaged with said first tang;
where said third retainer is removably engaged with said second tang;
where said first retainer is removably engaged with said substrate; and
where said information handling system further comprises a first solid state drive (SSD) removably attached to said bracket at said attachment point and electrically coupled or connected to circuitry of the information handling system.

21. A method for changing a SSD present in an information handling system of claim 19, the information handling system further including a second set of said substrate features present in a different location on said substrate from the first set of substrate features, said second set of substrate features having the same characteristics of said first set of substrate features, and said method comprising the steps of:

detaching a first solid state drive (SSD) from said bracket and removing the first SSD from electrical coupling or connection with circuitry of the information handling system;

removing said first SSD from said information handling system;

removing said bracket from said first set of substrate features;

then either one of:
  i) rotating said bracket 180 degrees about its Z-axis, and re-engaging said bracket in a new position relative to said first set of substrate features, or
  ii) re-engaging said bracket in a new position with said second set of substrate features; and
 providing a second and different SSD and having a different length than the first SSD;

attaching said second SSD to said bracket while it is engaged in the new position; and electrically coupling or connecting the second SSD to the circuitry of the information handling system.

22. The method of claim 21, wherein said second SSD comprises a different amount of memory storage space than said first SSD; and wherein at least one of said first and second SSDs comprises an M.2 2242 SSD, and the other of the SSDs comprises a M.2 2230 SSD or a M.2 2280 SSD.

23. The method of claim 21, where each of the first and second SSDs comprises a card edge connector; and where the card edge connector of each given one of the first and second SSDs is disposed at a distance from the edge of a same mating socket connector of an adjacent substrate when each given one of the first and second SSDs is attached to the bracket at the attachment point of the bracket so that the card edge connector of each given one of the first and second SSDs is inserted into the same mating socket connector of the adjacent substrate to electrically couple the given first or second SSD to circuitry of the information handling system.

\* \* \* \* \*